United States Patent [19]
Sauerbrey et al.

[11] Patent Number: 5,838,273
[45] Date of Patent: Nov. 17, 1998

[54] FULLY DIFFERENTIAL DIGITAL-TO-ANALOG CONVERTER WITH A LOW NUMBER OF RESISTORS

[75] Inventors: Jens Sauerbrey; Oliver Kiehl, both of Munich, Germany

[73] Assignee: Siemens Aktiengesellschaft, Munich, Germany

[21] Appl. No.: 907,526

[22] Filed: Aug. 8, 1997

[30] Foreign Application Priority Data

Aug. 8, 1996 [DE]  Germany .................. 196 32 093.3

[51] Int. Cl.⁶ .................................................. H03M 1/66
[52] U.S. Cl. ........................................ 341/145; 341/144
[58] Field of Search ................................ 341/144, 145, 341/143, 155, 156

[56] References Cited

U.S. PATENT DOCUMENTS

| | | | |
|---|---|---|---|
| 4,899,151 | 2/1990 | Colles ....................................... | 341/145 |
| 4,971,979 | 11/1990 | Ikeda ........................................ | 341/154 |
| 5,059,978 | 10/1991 | Valdenaire ............................... | 341/145 |
| 5,181,034 | 1/1993 | Takakura et al. ........................ | 341/144 |
| 5,252,975 | 10/1993 | Yuasa et al. .............................. | 341/145 |
| 5,353,027 | 10/1994 | Vorenkamp et al. .................... | 341/156 |
| 5,568,147 | 10/1996 | Matsuda et al. ......................... | 341/154 |
| 5,627,537 | 5/1997 | Quinlan et al. .......................... | 341/144 |
| 5,673,045 | 9/1997 | Sato et al. ................................ | 341/144 |

OTHER PUBLICATIONS

A 10–b 50–MHZ CMOS D/A Converter with 75—'Ω Buffer by Marcel J.M. Pelgrom, pp. 1347–1352.

A 12 bit 1 MHz ADC with ImW Power Consumption by Kouichi Satoue t al., pp. 515/518.

*Primary Examiner*—Marc S. Hoff
*Assistant Examiner*—Peguy Jean-Pierre
*Attorney, Agent, or Firm*—Hill & Simpson

[57] ABSTRACT

A fully differential resistor-string digital-to-analog converter wherein a resistor network having half the number of resistors of an otherwise standard digital-to-analog convertor of this type is enabled with the assistance of a first decoder, a second decoder and a subtraction unit thus reducing the required chip area and the overall switching time.

8 Claims, 2 Drawing Sheets

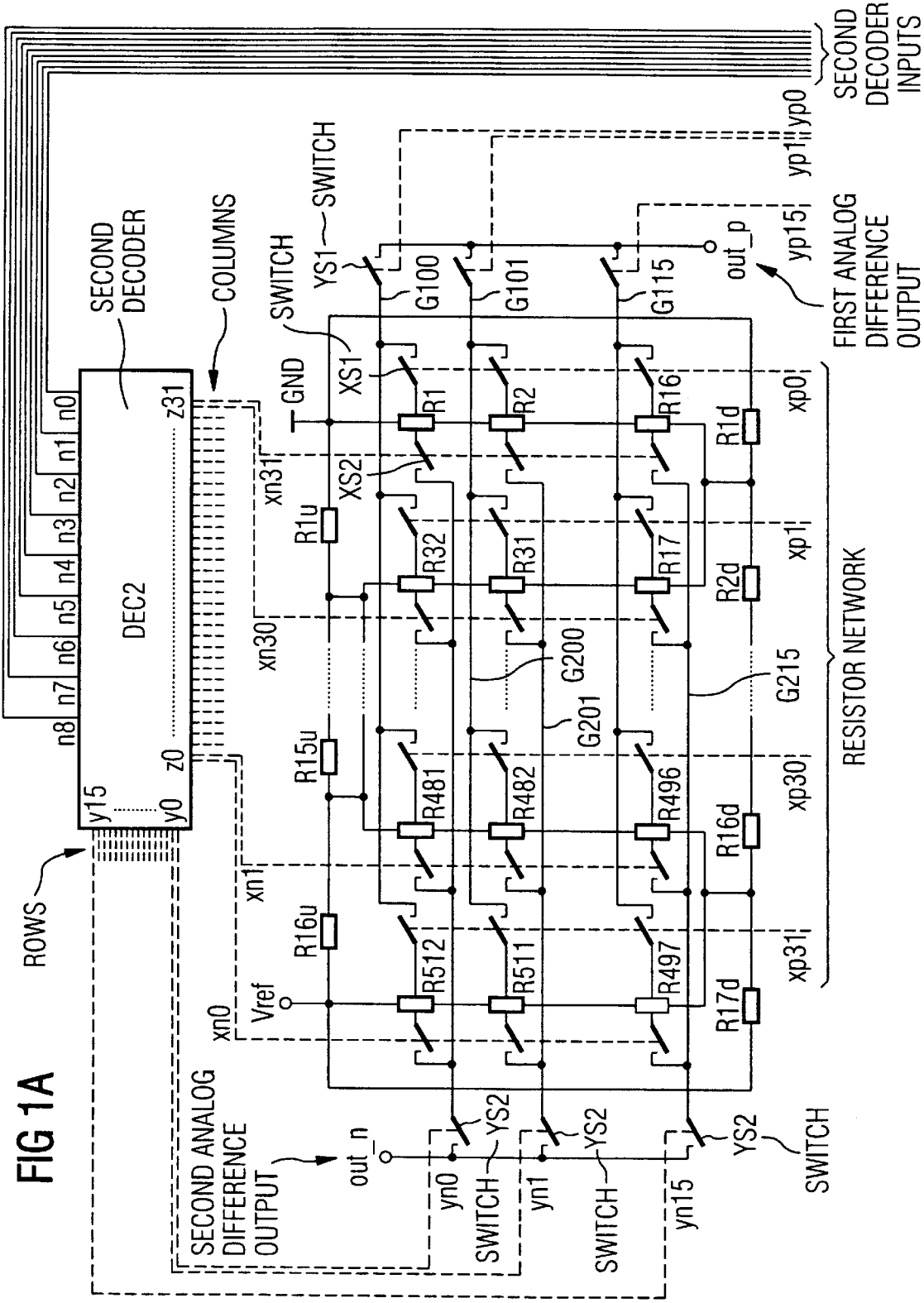

FULLY DIFFERENTIAL DIGITAL-TO-ANALOG CONVERTER WITH A LOW NUMBER OF RESISTORS

BACKGROUND OF THE INVENTION

1. Field of the Invention

The present invention is directed to a fully differential resistor-string digital-to-analog convertor wherein a resistor network, having only half the number of resistors as a conventional digital-to-analog convertor of this type, is enabled with the assistance of a first decoder, a second decoder and a subtraction unit resulting in reduced switching time and required chip area.

2. Description of the Prior Art

A signal which is received, and understood, by an analog-to-digital converter is what is referred to as a resistor-string digital-to-analog converter. Given a resolution of k bits, known digital-to-analog converters of this species, for example, include $2^k$ series-connected resistors that are all of the same size and at which $2^k$ sub-voltages can be taken to ground. What is thereby disadvantageous about this species of digital-to-analog converter is that a great number of resistors are required compared to other digital-to-analog conversion principles. Indeed, the large area which is required for these resistors leads to relatively high parasitic capacitances for high resolutions and, therefore, to relatively long transient periods.

U.S. Pat. No. 5,059,978 discloses a resistor-string digital-to-analog converter wherein one or two resistor strings are additionally connected in parallel in order to diminish the effective resistance of the nodes in the resistor string and, thus, to improve the time behavior.

When a digital-to-analog converter outputs a fully differential output signal, however, a positive and a negative branch must be separately decoded. The advantage of the fully differential drive is comprised in the increased signal boost and in the improved power supply rejection ration (PSSR). Differing from what is referred to as the "single-ended realization," every node in the resistor string of the two branches must be separately tapped, thus making the number of required switches increase to 2 ($2^k$).

SUMMARY OF THE INVENTION

An object of the present invention, therefore, is to provide a fully differential resistor-string digital-to-analog converter that exhibits optimally short transient periods. This object is achieved in a fully differential digital-to-analog converter including a matrix-shaped resistor network, a first decoder, a second decoder and a subtraction unit wherein an input data word is supplied to the first decoder directly and to the second decoder via the subtraction unit. The digital-to-analog converter is configured, and operated, in such a way that only half the number of resistors are required in the resistor network as in conventional digital-to-analog converters.

In an embodiment, a fully differential digital-to-analog convertor is provided which includes a resistor network (which may, alternatively, consist of first and second resistor networks), a first decoder, a second decoder and a subtraction unit. An input data word with k data bits is supplied to the first decoder directly and to the second decoder through the subtraction unit which decrements the input data word by the number 1. The resistor network includes a series circuit having $2^{k-1}$ resistors wherein center taps of the resistors in this resistor network are connectable to first coarse selection lines by switches driven by the first decoder and are connectable to second coarse selection lines by switches driven by the second decoder. Incrementing column numbers are addressed at either the first or second decoder with increasing bit significance and decrementing column numbers are addressed at the other decoder with increasing bit significance of an appertaining decoder input signal. The first coarse selection lines are connectable to a first analog difference output by additional switches driven by the first decoder and the second coarse selection lines are connectable to a second analog difference output by additional switches driven by the second decoder.

In an embodiment, the fully differential digital-to-analog converter also includes first and second resistor strings having sub-resistors of relatively low impedance compared to the k−1 resistors of the resistor network. A beginning of a column of the resistor network is connected to a tap of the first resistor string and an end of a column of the resistor network is connected to a tap of the second resistor string.

In an embodiment, the resistor network of the fully differential digital-to-analog convertor is configured so that the number of columns differs from the number of rows by at most 1.

Additional features and advantages of the present invention are described in, and will be apparent from, the detailed description of the presently preferred embodiments and from the drawings.

DESCRIPTION OF THE DRAWINGS

FIG. 1a shows a schematic diagram of a resistor network operationally connected to a second decoder in accordance with the principles of the present invention.

DETAILED DESCRIPTION OF THE PREFERRED EMBODIMENTS

Figure 1B:
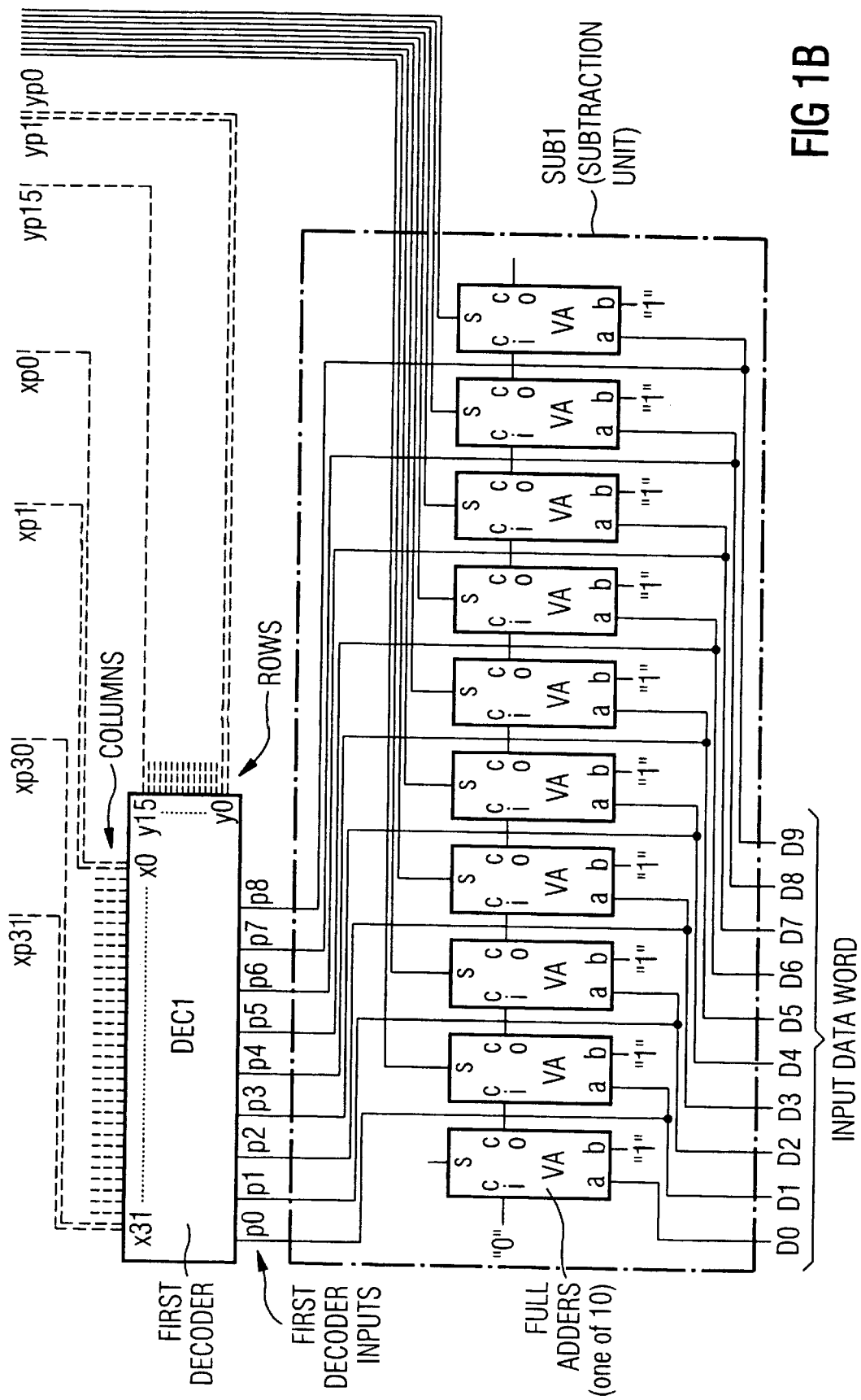
FIG. 1b shows a schematic diagram of a subtraction unit operationally connected to a first decoder in accordance with the principles of the present invention.

Given the operational interconnectivity between the schematics shown in FIGS. 1a and 1b, the Detailed Description will discuss both figures simultaneously.

The combined drawings show an inventive 10-bit digital-to-analog converter that is referred to in short as DAC below. The DAC includes a matrix-shaped resistor network (see FIG. 1a), two decoders DEC1 and DEC2 as well as a subtraction unit SUB1. An input data word having the data bits D0 . . . D9 is supplied to the DAC at inputs p0 . . . p8 of the decoder DEC1. The LSB of the data bits D0 . . . D9, however, is not supplied as such. The number 1 is subtracted from the 10-bit input data word D0 . . . D9 by addition of the value 11111 11111 in the subtraction unit SUB1. The subtraction unit SUB1 is composed of 10 full adders VA. All sum outputs of the full adders, except for the sum output of the full adder for the LSB, are supplied to the nine inputs n0 . . . n8 of the second decoder DEC2.

Generally speaking, two decoders, each having a resolution of k-1 bits, are required for a DAC with a resolution of k. Advantageously, the two decoders DEC1 and DEC2 can be identically constructed wherein, for each bit combination at the input of each decoder, exactly one column of the columns x0 . . . x31 and exactly one row of the rows y0 . . . y15 of the matrix-shaped resistor network may be selected.

In order to optimally utilize the chip area, the resistor network is designed as quadratic as possible. As a result, the number of rows and the number of columns of the two decoders at most differ by one; namely, when the bit width of the decoder is odd-numbered. The decoders DEC1 and DEC2, with a resolution of nine bits as shown in this example, include $2^5$ column outputs x0 . . . x31 and $2^4$ row outputs y0 . . . y15.

The resistor network itself includes a series circuit of $2^{k-1}$ resistors R1 . . . R512 particularly arranged wherein the center taps are respectively connected via switches XS1 to first coarse selection lines G100–G115 and via switches XS2 to second coarse selection lines G200–G215. Incrementing column numbers are addressed at the decoder outputs x0. . . x31 at one of the two decoders with increasing bit significance of the coarse selection. Decrementing column numbers of the matrix-like resistor network are addressed at the other decoder with increasing bit significance. The first coarse selection lines G100–G115 are connectable by switches YS1 to a first analog difference output out_p and the coarse selection lines G200–G215 are connectable via switches YS2 to a second analog difference output out_n. The switches YS1 are thereby driven by the row outputs y0 . . . y15 of the decoder DEC1, and the switches YS2 are driven by the row outputs y0 . . . y15 of the decoder DEC2. A fine selection of the voltages already coarsely selected by the switches XS1 and XS2 is undertaken here with the assistance of the 16 switches YS1 and YS2, respectively.

For lowering the overall impedance of the resistor network, a resistor string composed of the resistors R1u . . . R16u and another resistor string composed of the resistors R1d . . . R17d are additionally provided specifically for DACs having high switching frequencies. Compared to other resistors, these resistance divider strings have resistances which are significantly lower in impedance (a relatively low-impedance sub-voltage of an overall reference voltage Vref) and further ensure that there is a connection after every column (i.e., after 16 resistors of the series circuit). A respective beginning of a column of the resistor network is thereby connected to a tap of the first resistance divider network and the respective end of a column is connected to a tap of the second resistance divider string. As a result of this measure, the ohmic resistance of the resistor network and, thus, the switching time of the DAC are diminished given an approximately constant capacitance.

The number of resistors in a DAC is cut in half in accordance with the present invention. In this example, only $2^{k-1}=512$ resistors are required and not $2^k=1024$. This has the advantage in that the resistor matrix now requires only half the area. The halving of the number of resistors reduces, first of all, the parasitic capacitances that determine the transiency of the resistor network. Second of all, the ratio of length/width must be doubled in the layout of the resistors R1 . . . R512 in order to obtain a comparable current in the resistor network since the surface resistance represents a constant. The doubling of the ratio occurs by halving the width of the resistors. This halving of the width, in turn, leads to another reduction of the parasitic capacitance and, thus, to an enhanced switching speed of the DAC. Compared to known, fully differential resistor string DACs, the transient periods associated with the present invention can be reduced to less than 50% given the same power consumption. Given the same transient period, this means a clear reduction in the required current and, accordingly, a reduction of the power.

If the input data word D0 . . . D9 were respectively incremented by the number 1, in steps, then the input word of the decoder DEC1 and, with the next incrementation of the input word, the input signal of the decoder DEC2, etc., would be incremented in alternation. A resolution of k bits is achieved in this way even though only $2^k-1$ resistors are provided in the series circuit and the two decoders only exhibit the bit width k–1. The word pending at the DAC is allowed to assume values between 1 and 1023. In this way, it is assured that a differential output voltage of 0 volts is adjacent given an input data word in the middle of the defined input range; for example, 512 as shown here. Furthermore, given an input data word with the value of 0, an overflow is prevented from occurring in the only k-bit wide subtraction unit SUB1.

Instead of including a resistor network with $2^{k-1}$ resistors, another embodiment of the invention includes two resistor networks with $2^{k-1}$ resistors each whereby the center taps of the resistors of the first resistor network are through-connectable onto the first coarse selection lines G100 . . . G115 only via the switches XS1 and the center taps of the resistors of the second resistor network are through-connectable onto the second coarse selection lines G200 . . . G215 only via the switches XS2. In this development, $2^k$ resistors are, in fact, required as is known in DACs of this species, but the impedance of the resistor networks and, thus, the switching speed of the DAC are improved over known DACs of this species.

I claim as my invention:

1. A fully differential digital-to-analog converter, comprising:

a first matrix-shaped resistor network;

a second matrix-shaped resistor network;

a first decoder;

a second decoder; and a subtraction unit;

wherein an input data word with k data bits is supplied to the first decoder directly and supplied to the second decoder via the subtraction unit where the subtraction unit decrements the data word by the number 1; wherein the first resistor network and the second resistor network comprise a series circuit of $2^{k-1}$ resistors; wherein center taps of resistors in the first resistor network are connectable to first coarse selection lines via switches driven by the first decoder and center taps of resistors in the second resistor network are connectable to second coarse selection lines via switches driven by the second decoder; wherein incrementing column numbers are addressed at one of either the first decoder or the second decoder with increasing bit significance and decrementing column numbers are addressed at the other of either the first decoder or the second decoder with increasing bit significance of an appertaining decoder input signal; and wherein the first coarse selection lines are connectable to a first analog difference output via additional switches driven by the first decoder and the second coarse selection lines are connectable to a second analog difference output via additional switches driven by the second decoder.

2. The fully differential digital-to-analog converter as claimed in claim 1, further comprising:

a first resistor string provided for the first resistor network having sub-resistors of low impedance compared to the $2^{k-1}$ resistors of the first and second resistor networks; and a second resistor string provided for the second resistor network having sub-resistors of low impedance compared to the $2^{k-1}$ resistors of the first and second resistor networks;

wherein a beginning of a column of each resistor network is connected to a tap of the first resistor string and an end of a column of each resistor network is connected to a tap of the second resistor string.

3. The fully differential digital-to-analog converter as claimed in claim 1, wherein the first and second resistor networks are configured such that the number of columns differs from the number of rows by at most 1.

4. The fully differential digital-to-analog converter as claimed in claim 2, wherein the first and second resistor networks are configured such that the number of columns differs from the number of rows by at most 1.

5. A fully differential digital-to-analog converter, comprising:

a matrix-shaped resistor network;

a first decoder;

a second decoder; and a subtraction unit;

wherein an input data word with k data bits is supplied to the first decoder directly and supplied to the second decoder via the subtraction unit where the subtraction decrements the data word by the number 1; wherein the resistor network comprises a series circuit of $2^{k-1}$ resistors; wherein center taps of resistors in the resistor network are connectable to first coarse selection lines via switches driven by the first decoder and to second coarse selection lines via switches driven by the second decoder; wherein incrementing column numbers are addressed at one of either the first decoder or the second decoder with increasing bit significance and decrementing column numbers are addressed at one of either the first decoder or the second decoder with increasing bit significance of an appertaining decoder input signal; and wherein the first coarse selection lines are connectable to a first analog difference output via additional switches driven by the first decoder and the second coarse selection lines are connectable to a second analog difference output via additional switches driven by the second decoder.

6. The fully differential digital-to-analog converter as claimed in claim 5, further comprising:

a first resistor string having sub-resistors of low impedance compared to the $2^{k-1}$ resistors of the resistor network; and a second resistor string having sub-resistors of low impedance compared to the $2^{k-10}$ resistors of the resistor network;

wherein a beginning of a column of the resistor network is connected to a tap of the first resistor string and an end of a column of the resistor network is connected to a tap of the second resistor string.

7. The fully differential digital-to-analog converter of as claimed in claim 5, wherein the resistor network is configured such that the number of columns differs from the number of rows by at most 1.

8. The fully differential digital-to-analog convertor of as claimed in claim 6, wherein the resistor network is configured such that the number of columns differs from the number of rows by at most 1.

* * * * *